(12) United States Patent
Xu et al.

(10) Patent No.: US 10,158,046 B2
(45) Date of Patent: Dec. 18, 2018

(54) SEMICONDUCTOR ELEMENT AND FABRICATION METHOD THEREOF

(71) Applicant: XIAMEN SANAN OPTOELECTRONICS TECHNOLOGY CO., LTD., Xiamen (CN)

(72) Inventors: Zhibo Xu, Xiamen (CN); Sheng-wei Chou, Xiamen (CN); Chih-ching Cheng, Xiamen (CN); Xiao Wang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/607,505

(22) Filed: May 28, 2017

(65) Prior Publication Data
US 2017/0263819 A1 Sep. 14, 2017

Related U.S. Application Data

(63) Continuation of application No. PCT/CN2016/097757, filed on Sep. 1, 2016.

(30) Foreign Application Priority Data

Sep. 29, 2015 (CN) .......................... 2015 1 0629914

(51) Int. Cl.
*H01L 33/00* (2010.01)
*H01L 33/44* (2010.01)
*H01L 29/06* (2006.01)
*H01L 33/02* (2010.01)
*H01L 21/02* (2006.01)

(52) U.S. Cl.
CPC ............ *H01L 33/44* (2013.01); *H01L 21/022* (2013.01); *H01L 21/02172* (2013.01); *H01L 29/0653* (2013.01); *H01L 33/005* (2013.01); *H01L 33/02* (2013.01)

(58) Field of Classification Search
CPC ................................ H01L 33/48; H01L 27/15
USPC .......................................................... 257/79
See application file for complete search history.

(56) References Cited

U.S. PATENT DOCUMENTS

| | | | |
|---|---|---|---|
| 8,823,025 B1 * | 9/2014 | Arkun ............... | H01L 21/02458 257/94 |
| 8,884,393 B2 * | 11/2014 | Kokawa ............ | H01L 29/66462 257/438 |
| 9,233,844 B2 * | 1/2016 | Chen ..................... | B82Y 10/00 |

(Continued)

*Primary Examiner* — Vu A Vu
(74) *Attorney, Agent, or Firm* — Syncoda LLC; Feng Ma; Junjie Feng

(57) ABSTRACT

A semiconductor element has a metal protective layer and a metal oxide protective layer formed on the substrate to prevent the Si substrate surface from forming an amorphous layer; and a transition layer to reduce lattice difference between the metal oxide protective layer and the III-V-group buffer layer, thus improving crystal quality of the III-V-group buffer layer. A fabrication method can avoid formation of amorphous layers and cracks surrounding the Si substrate surface. A light-emitting diode (LED) element or a transistor element can be formed by depositing a high-quality multi-layer buffer structure via PVD and forming a GaN, InGaN or AlGaN epitaxial layer thereon.

11 Claims, 4 Drawing Sheets

(56) References Cited

U.S. PATENT DOCUMENTS

| | | | |
|---|---|---|---|
| 9,773,871 B2* | 9/2017 | Chang | H01L 29/1083 |
| 2002/0084461 A1* | 7/2002 | Hilt | H01L 21/02381 |
| | | | 257/79 |
| 2003/0015767 A1* | 1/2003 | Emrick | H01L 21/8258 |
| | | | 257/528 |
| 2012/0119332 A1* | 5/2012 | Atanackovic | H01L 21/0242 |
| | | | 257/616 |
| 2014/0302665 A1* | 10/2014 | Stauss | H01L 21/02381 |
| | | | 438/478 |
| 2014/0361371 A1* | 12/2014 | Comeau | H01L 27/1203 |
| | | | 257/351 |

\* cited by examiner

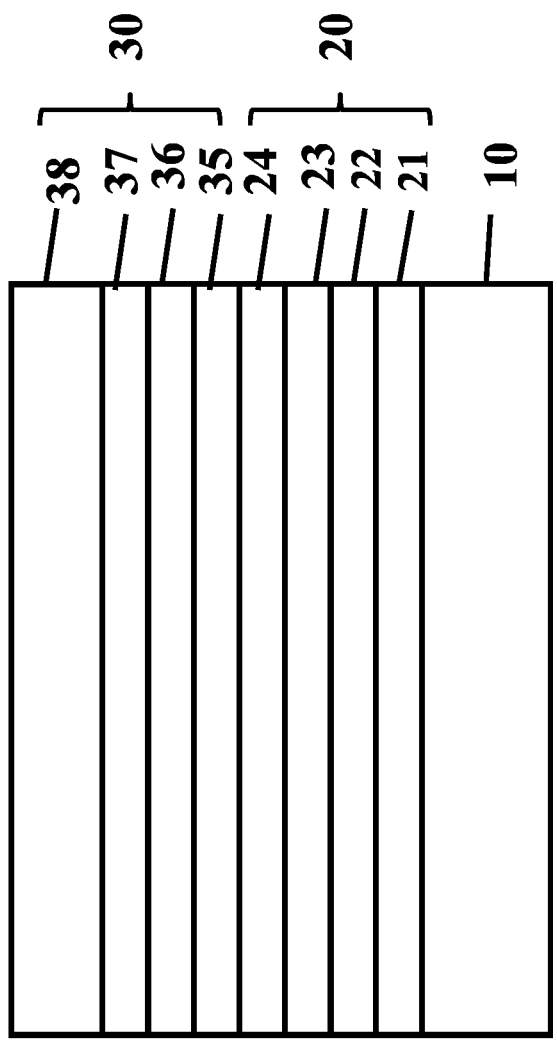

SEMICONDUCTOR ELEMENT AND FABRICATION METHOD THEREOF

CROSS-REFERENCE TO RELATED APPLICATIONS

The present application is a continuation of, and claims priority to, PCT/CN2016/097757 filed on Sep. 1, 2016, which claims priority to Chinese Patent Application No. 201510629914.9 filed on Sep. 29, 2015. The disclosures of these applications are hereby incorporated by reference in their entirety.

BACKGROUND

Physical vapor deposition (PVD) is an easy-to-operate process that consumes little raw material and causes little environmental pollution. Moreover, the film formed via PVD is dense and even, and is tightly bonded to the base. With these advantages, PVD is increasingly applied in fabrication of semiconductor elements, in particular, to fabrication of bottom layers of epitaxial wafer. For example, by depositing an AlN layer as the buffer layer, defects from lattice mismatch and thermal mismatch between the substrate and the epitaxial layer can be minimized, and the stress caused therefrom can be eased, thus improving quality of the semiconductor element.

Compared with chemical vapor deposition (CVD), atoms sputtered from PVD have higher energy (in general 10~20 eV) and migration ability. Therefore, a high-quality buffer layer can be deposited via PVD. In particular, for materials with strong bond energy like AlN, film layers deposited via PVD are better than those deposited with MOCVD. However, direct growth of AlN on the Si substrate surface via PVD is likely to form an amorphous silicon oxide layer at the contact surface between the substrate and AlN, leading to poor quality of subsequently-formed AlN layer and the defects below: as a stress buffer layer, the AlN layer has inconsistent stress release ability, and the stress is concentrated in the amorphous silicon nitride layer of the contact layer, resulting in cracks that degrade quality of semiconductor elements; in addition, the AlN layer with lower density would generate holes, through which, Gallium would corrode the Si substrate in subsequent chemical vapor deposition of Ga-containing nitride. This would form pits and lead to poor performance of semiconductor devices.

SUMMARY

To solve the above problems, various embodiments of the present disclosure provide a semiconductor element, wherein, a metal protective layer and a metal oxide protective layer are formed on the substrate to prevent the Si substrate surface from forming an amorphous layer; and a transition layer is formed to reduce lattice difference between the metal oxide protective layer and the III-V-group buffer layer, thus improving crystal quality of the III-V-group buffer layer. Some embodiments of the present disclosure also provide a fabrication method to avoid formation of amorphous layers and cracks surrounding the Si substrate surface. Meanwhile, a LED element or a transistor element is formed by depositing a high-quality multi-layer buffer structure via PVD and forming a GaN layer, an InGaN layer or an AlGaN layer thereon.

Technical approaches of some embodiments disclosed herein can include: a semi-conductor element, comprising a Si substrate, a multi-layer buffer structure and an epitaxial function layer, wherein, the multi-layer buffer structure comprises a metal protective layer, a metal oxide protective layer, a transition layer and an III-V-group buffer layer in sequence; in which, the metal protective layer and the metal oxide protective layer prevent the Si substrate surface from forming an amorphous layer; and the transition layer reduces lattice difference between the metal oxide protective layer and the III-V-group buffer layer, thus improving crystal quality of the III-V-group buffer layer.

In some embodiments, the metal protective layer is made of aluminum with thickness of 1~100 Å.

In some embodiments, the metal oxide protective layer is made of aluminum oxide with a thickness of 1~500 Å.

In some embodiments, the transition layer is made of oxygen-doped AlN, with oxygen-doping concentration of $\geq 1 \times 10^{19}$ cm$^{-3}$.

In some embodiments, the III-V-group buffer layer is made of oxygen-doped AlN, with oxygen-doping concentration of $\leq 4 \times 10^{22}$ cm$^{-3}$.

Some embodiments of the present disclosure also provide a method for fabricating the semiconductor element structure by forming a multi-layer buffer structure and an epitaxial function layer on the Si substrate, wherein, the multi-layer buffer structure is formed by:

depositing a metal protective layer on the Si substrate surface via PVD;

feeding oxygen to oxidize the upper surface of the metal protective layer, and depositing a metal oxide protective layer on the metal protective layer via PVD;

keeping feeding of oxygen and feeding nitrogen, and depositing a transition layer on the surface of the metal oxide protective layer via PVD;

stop feeding oxygen, and keeping feeding of nitrogen, and depositing an III-V-group buffer layer on the transition layer surface via PVD to form a multi-layer buffer structure.

In some embodiments, the metal protective layer is made of aluminum with thickness of 1~100 Å.

In some embodiments, the metal oxide protective layer is made of aluminum oxide with thickness of 1~500 Å.

In some embodiments, the transition layer is made of oxygen-doped AlN with oxygen concentration of $\geq 1 \times 10^{19}$ cm$^{-3}$ and thickness of 1~1000 nm.

In some embodiments, the transition layer is made of oxygen-doped AlN with oxygen concentration of $\geq 1 \times 10^{19}$ cm$^{-3}$ and thickness of 5~50 nm.

In some embodiments, the III-V-group buffer layer is made of oxygen-doped AlN with an oxygen concentration of $\leq 4 \times 10^{22}$ cm$^{-3}$ and a thickness of 10~1000 nm.

In some embodiments, the III-V-group buffer layer is made of oxygen-doped AlN with oxygen concentration of $\leq 4 \times 10^{22}$ cm$^{-3}$ and thickness of 200~300 nm.

In some embodiments, oxygen-doping concentration of the transition layer is higher than that of the III-V-group buffer layer.

In some embodiments, the epitaxial function layer is a GaN-based LED epitaxial layer or an AlGaN transistor epitaxial layer.

In another aspect, a system is provided including a plurality of the semiconductor elements described above. In the case that the semiconductor element comprises an LED element, the system can be a light-emitting system used for lighting, signage, display, etc.

At least some of the embodiments of the present disclosure can have at least one or more of the following advantageous effects:

1. In some embodiments, a metal protective layer and a metal oxide protective layer are formed to prevent the Si substrate surface from forming an amorphous layer, thus avoiding cracks and poles, and further preventing Ga in subsequent Ga-containing nitride from corroding the Si substrate through the poles, and degrading performance of semiconductor devices; and a transition layer is formed to reduce lattice difference between the metal oxide protective layer and the III-V-group buffer layer, thus improving crystal quality of the III-V-group buffer layer.

2. When the multi-layer buffer structure is deposited via PVD, as the sputtered atoms have high energy and migration rate, the deposited film layers outperform those formed via conventional CVD and thereby obtaining a buffer layer interface with high flatness; when GaN, AlGaN or InGaN film layer is then formed thereon, dislocation and defect density are greatly reduced, thus reducing electric leakage, and improving crystal quality and reliability of nitride semiconductor devices. As a result, the luminous efficiency and electron mobility of the entire light-emitting semiconductor device are improved.

BRIEF DESCRIPTION OF THE DRAWINGS

The accompanying drawings, which are included to provide a further understanding of the invention and constitute a part of this specification, together with the embodiments, are therefore to be considered in all respects as illustrative and not restrictive. In addition, the drawings are merely illustrative, which are not drawn to scale.

FIG. 4 is a structural diagram of a semiconductor structure of Embodiment 2.

Figure 1:
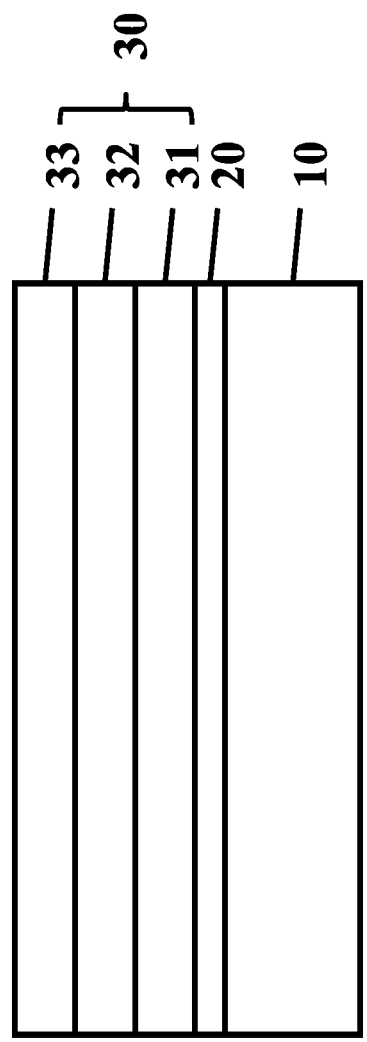
FIG. 1 is first structural diagram of a semiconductor structure of Embodiment 1.

In the drawings: 10. Si substrate; 20. multi-layer buffer structure; 21. metal protective layer; 22. metal oxide protective layer; 23. transition layer; 24. III-V-group buffer layer; 30. epitaxial function layer; 31. first semiconductor layer; 32. light-emitting layer; 33. second semiconductor layer; 34. non-doping semiconductor layer; 35. AlGaN layer; 36. GaN semiconductor layer; 37. AlGaN semiconductor layer; 38. GaN semiconductor covering layer.

DETAILED DESCRIPTION

The embodiments of the present disclosure will be described in detail with reference to the accompanying drawings and embodiments.

Embodiment 1

Figure 2:
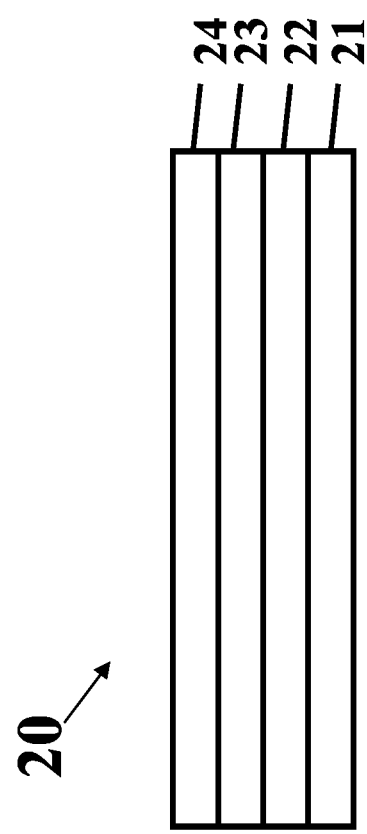
FIG. 2 is a structural diagram of multi-layer buffer structure of Embodiment 1.
Figure 3:
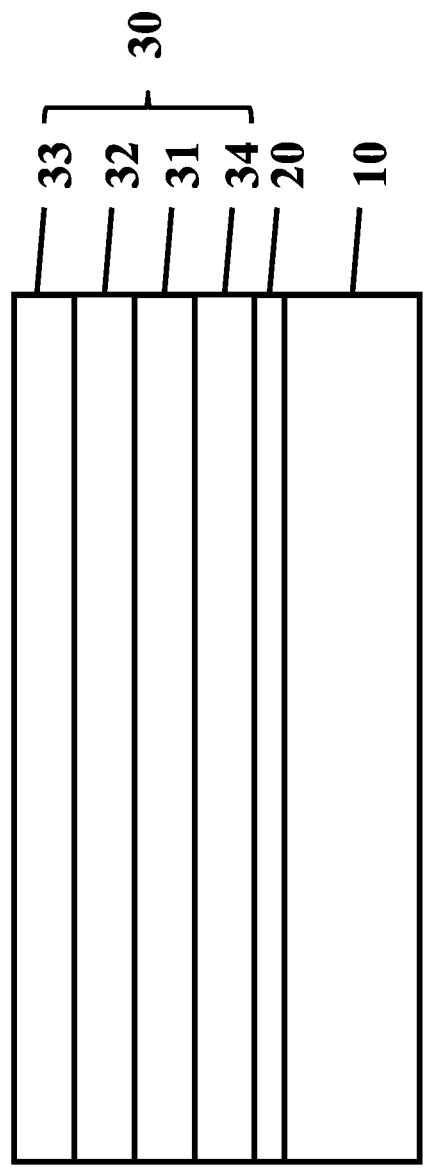
FIG. 3 is second structural diagram of a semiconductor structure of Embodiment 1.

Referring to FIGS. 1 and 2, this embodiment provides a semiconductor element, comprising: a Si substrate 10, a multi-layer buffer structure 20 and an epitaxial function layer 30, wherein, the epitaxial function layer 30 is a LED epitaxial layer composed of a first semiconductor layer 31, a light-emitting layer 32 and a second semiconductor layer 33; the first semiconductor layer 31 is a semiconductor layer doped with donor impurity, and the second semiconductor layer 33 is a semiconductor layer doped with acceptor impurity. The semiconductor element according to some embodiments can also comprise a non-doping semiconductor layer 34 (Referring to FIG. 3). The multi-layer buffer structure 20 is composed of a 1~100 Å metal protective layer 21, a 1~500 Å metal oxide protective layer 22, a 1~1,000 nm transition layer 23 and a 10~1,000 nm III-V-group buffer layer 24. In this embodiment, a 5~50 nm transition layer 23 and a 200~300 nm III-V-group buffer layer 24 are preferred. Materials of the metal protective layer 21, the metal oxide protective layer 22, the transition layer 23 and the III-V-group buffer layer 24 are aluminum, aluminum oxide, oxygen-doped AlN with oxygen concentration of $\geq 1\times10^{19}$ cm$^{-3}$ and oxygen-doped AlN with oxygen concentration of $\leq 4\times10^{22}$ cm$^{-3}$, wherein, to improve crystal quality of subsequently-deposited epitaxial layer, in this embodiment, oxygen-doping concentration of the transition layer 23 is higher than that of the III-V-group buffer layer 24.

As a small amount of oxygen would be doped during depositing of an AlN buffer layer via conventional PVD, the Si substrate 10 is likely to be oxidized; therefore, when the AlN buffer layer containing micro oxygen is directly deposited on the surface of the Si substrate 10, the Si substrate 10 surface is oxidized into an amorphous silicon oxide layer. This amorphous silicon oxide layer leads to poor quality of the contact surface between the subsequently-deposited AlN buffer layer and the substrate 10, easy to generate cracks that degrade quality of the semiconductor devices; meanwhile, the amorphous silicon oxide layer lowers density of the AlN buffer layer and generates holes. In subsequent depositing of a Ga-containing nitride layer via MOCVD, Ga would corrode the Si substrate through the holes and form pits, which lead to poor performance of semiconductor devices. In the multi-layer buffer structure 20 of this embodiment, an Al protective layer 21 covers on the surface of the Si substrate 10 to prevent the Si substrate 10 surface from being oxidized as its direct contact with oxygen is blocked; then an aluminum oxide layer 22 is deposited to mitigate the Al protective layer 21 from being oxidized in subsequent depositing, which further protects the surface of the Si substrate 10 and avoids formation of an amorphous layer; then, a transition layer 23 with oxygen-doping concentration $\geq 1\times10^{19}$ cm$^{-3}$ and an III-V-group buffer layer 24 with oxygen-doping concentration $\leq 4\times10^{22}$ cm$^{-3}$ are formed, wherein, the transition layer 23 effectively reduces lattice difference between the aluminum oxide layer 22 and the III-V-group buffer layer 24, and improves crystal quality of the III-V-group buffer layer 24, thus reducing internal crystal defects and dislocation of the subsequently-deposited epitaxial layer and improving performance the semiconductor.

To achieve the above structure and function, some embodiments of the present disclosure provide a method for fabricating the semiconductor epitaxial structure by forming a multi-layer buffer structure and an epitaxial function layer on the Si substrate, wherein, the multi-layer buffer layer can be formed by a process including one or more of the following steps.

First, providing a Si substrate 10 and putting it in a PVD chamber;

cleaning the surface of the Si substrate 10 to remove impurities; in this step, the substrate 10 surface is cleaned with self-bias RF sputtering method under high temperature H2 or inert gas; wherein, inert gas is any one of argon, helium or neon. In this embodiment, argon is preferred.

Next, depositing a metal protective layer 21 on the Si substrate 10 surface via PVD; wherein, the metal protective layer 21 is made of aluminum; in this embodiment, magnetron sputtering is preferred.

Feeding oxygen to oxidize the upper layer of the metal protective layer 21, and depositing a metal oxide protective layer 22 on the surface of the metal protective layer 21 via PVD; wherein, the metal oxide protective layer 22 is made of aluminum oxide.

Keeping feeding of oxygen and feeding nitrogen, feeding a transition layer 23 on the metal oxide protective layer 22 via PVD, wherein, the transition layer is made of oxygen-doped AlN material with oxygen concentration of $\geq 1\times10^{19}$ cm$^{-3}$.

Last, stop feeding oxygen, and keep feeding of nitrogen; then, depositing an III-V-group buffer layer 24 made of oxygen-doped AlN material on the transition layer 23 surface via PVD to form a multi-layer buffer structure 20; wherein, oxygen concentration of the III-V-group buffer layer 24 is $\leq 4\times10^{22}$ cm$^{-3}$;

The multi-layer buffer structure 20 formed through this method features high crystal quality and flat interface. The dislocation, defect density and electric leakage of subsequently-formed Ga-containing LED are greatly reduced, thus improving device reliability and luminous efficiency of the entire light-emitting semiconductor device.

Embodiment 2

Referring to FIG. 4, difference between this embodiment and

Embodiment 1 may include, a transistor epitaxial layer is deposited on the surface of the multi-layer buffer structure 20 as the epitaxial function layer 30, so as to form a transistor element. The fabrication method is structure is as follows: put the substrate of the multi-layer buffer structure 20 deposited with the metal protective layer 21, the metal oxide protective layer 22, the transition layer 23 and the III-V-group buffer layer 24 into the MOCVD chamber, and deposit an AlGaN layer 35 via MOCVD to further mitigate lattice stress of the multi-layer buffer structure 20 and avoid cracks; then, deposit an unintentionally doped or C-doped or Fe-doped GaN semiconductor layer 36, and then an AlGaN semiconductor layer 37, wherein, the AlGaN semiconductor layer 37 generates high-density electron gas at interface through electric field polarization; and finally, deposit an GaN semiconductor covering layer 38, wherein, the covering layer 38 acts as a contact layer, to fabricate electrode and finally form a transistor element.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A semiconductor element, comprising: a Si substrate, a multi-layer buffer structure, and an epitaxial function layer, wherein: the multi-layer buffer structure comprises a metal protective layer, a metal oxide protective layer, a transition layer, and an oxygen-doped AlN buffer layer in sequence; wherein the metal protective layer and the metal oxide protective layer are configured to prevent the Si substrate surface from forming an amorphous layer; and the transition layer is configured to reduce a lattice difference between the metal oxide protective layer and the oxygen-doped AlN buffer layer, thereby improving crystal quality of the oxygen-doped AlN buffer layer.

2. The semiconductor element according to claim 1, wherein the metal protective layer is made of aluminum with a thickness of 1~100 Å.

3. The semiconductor element according to claim 1, wherein the metal oxide protective layer is made of aluminum oxide with a thickness of 1~500 Å.

4. The semiconductor element according to claim 1, wherein the transition layer is made of oxygen-doped AlN, with an oxygen-doping concentration of $\geq 1\times10^{19}$ cm.

5. The semiconductor element according to claim 1, wherein the oxygen-doped AlN buffer layer has an oxygen-doping concentration of $\leq 4\times10^{22}$ cm$^{-3}$.

6. A light-emitting system comprising a plurality of semiconductor elements, each element comprising: a Si substrate, a multi-layer buffer structure, and an epitaxial function layer, wherein: the multi-layer buffer structure comprises a metal protective layer, a metal oxide protective layer, a transition layer, and an oxygen-doped AlN buffer layer in sequence; wherein the metal protective layer and the metal oxide protective layer are configured to prevent the Si substrate surface from forming an amorphous layer; and the transition layer is configured to reduce a lattice difference between the metal oxide protective layer and the oxygen-doped AlN buffer layer, thereby improving crystal quality of the oxygen-doped AlN buffer layer.

7. The system according to claim 6, wherein the metal protective layer comprises aluminum with a thickness of 1~100 Å.

8. The system according to claim 6, wherein the metal oxide protective layer comprises aluminum oxide with a thickness of 1~500 Å.

9. The system according to claim 6, wherein the transition layer comprises oxygen-doped AlN, with an oxygen-doping concentration of $\geq 1\times10^{19}$ cm.

10. The system according to claim 6, wherein the oxygen-doped AlN buffer layer has an oxygen-doping concentration of $\leq 4\times10^{22}$ cm$^{-3}$.

11. The system according to claim 6, wherein each semiconductor element is fabricated by forming a multi-layer buffer structure and an epitaxial function layer on the Si substrate, wherein, the multi-layer buffer structure is formed by:
  depositing a metal protective layer on the Si substrate surface via physical vapor deposition (PVD);
  feeding oxygen to oxidize the upper surface of the metal protective layer, and depositing a metal oxide protective layer on the metal protective layer via PVD;
  keeping feeding of oxygen and feeding nitrogen, and depositing a transition layer on the surface of the metal oxide protective layer via PVD;
  stop feeding oxygen, and keeping feeding of nitrogen, and depositing the oxygen-doped AlN buffer layer on the transition layer surface via PVD to form a multi-layer buffer structure.

* * * * *